United States Patent
Simmermon et al.

(10) Patent No.: US 12,413,036 B2
(45) Date of Patent: Sep. 9, 2025

(54) THERMAL CONTROL APPARATUS FOR LASER SYSTEM

(71) Applicant: General Electric Company, Schenectady, NY (US)

(72) Inventors: David Scott Simmermon, Felicity, OH (US); Alex William Ariapad, Cincinnati, OH (US); Mark Samuel Bailey, Fairfield, OH (US)

(73) Assignee: General Electric Company, Evendale, OH (US)

( * ) Notice: Subject to any disclaimer, the term of this patent is extended or adjusted under 35 U.S.C. 154(b) by 1125 days.

(21) Appl. No.: 17/232,271

(22) Filed: Apr. 16, 2021

(65) Prior Publication Data

US 2022/0337014 A1    Oct. 20, 2022

(51) Int. Cl.
| | |
|---|---|
| *H01S 3/04* | (2006.01) |
| *B22F 12/20* | (2021.01) |
| *B22F 12/41* | (2021.01) |
| *B29C 64/268* | (2017.01) |
| *G01F 1/684* | (2006.01) |
| *H01S 5/024* | (2006.01) |

(52) U.S. Cl.
CPC ............... *H01S 3/04* (2013.01); *B22F 12/20* (2021.01); *B22F 12/41* (2021.01); *B29C 64/268* (2017.08); *G01F 1/6842* (2013.01); *H01S 5/02423* (2013.01)

(58) Field of Classification Search
CPC ..... H01L 23/473; H01S 3/0407; H01S 5/024; H01S 5/02423; H01S 5/02407; F28D 9/0012; F28D 2001/0273; F28F 3/022; F28F 3/025; F28F 3/048; F28F 13/12
See application file for complete search history.

(56) References Cited

U.S. PATENT DOCUMENTS

| | | | |
|---|---|---|---|
| 3,404,342 A | | 10/1968 | Allen |
| 4,315,225 A | * | 2/1982 | Allen, Jr. ............. H01S 5/0237 257/726 |

(Continued)

FOREIGN PATENT DOCUMENTS

| | | |
|---|---|---|
| CN | 203045151 U | 7/2013 |
| CN | 105576489 A * | 5/2016 |

(Continued)

*Primary Examiner* — Jianying C Atkisson
*Assistant Examiner* — For K Ling
(74) *Attorney, Agent, or Firm* — Dinsmore & Shohl LLP

(57) ABSTRACT

A thermal control apparatus including a body defining a centerline axis extended along a height and a circumferential direction extended relative to the centerline axis. The body forms a flow circuit therethrough, an inlet opening, and an outlet opening each in fluid communication with the flow circuit. The flow circuit is extended in parallel flow arrangement along the circumferential direction from the inlet opening to the outlet opening. A cavity is extended at least partially through the body along the centerline axis. A thermal control system includes the thermal control apparatus, a fluid flow device configured to provide a flow of heat transfer fluid to the apparatus through the inlet opening and to receive the flow of heat transfer fluid from the outlet opening of the apparatus, and a flow conduit providing fluid communication of the flow of heat transfer fluid between the fluid flow device and the apparatus.

16 Claims, 4 Drawing Sheets

(56) References Cited

U.S. PATENT DOCUMENTS

| | | | | |
|---|---|---|---|---|
| 4,454,602 | A * | 6/1984 | Smith | H01S 5/024 257/712 |
| 5,216,688 | A * | 6/1993 | Kortz | A61K 31/405 372/75 |
| 6,330,259 | B1 * | 12/2001 | Dahm | H01S 3/0941 372/75 |
| 8,659,191 | B2 | 2/2014 | Chamberlin et al. | |
| 10,618,134 | B2 | 4/2020 | Noeldner et al. | |
| 2003/0063639 | A1 * | 4/2003 | Yatskar | H01S 3/0941 372/36 |
| 2006/0191675 | A1 * | 8/2006 | Fletcher | F28F 3/022 165/172 |
| 2009/0306831 | A1 * | 12/2009 | Guggenmos | H01S 5/024 700/282 |
| 2012/0177073 | A1 * | 7/2012 | Stephens, IV | H01S 5/02423 372/35 |
| 2012/0230837 | A1 | 9/2012 | Shukla | |
| 2016/0214280 | A1 | 7/2016 | Ulemek et al. | |
| 2016/0230138 | A1 | 8/2016 | Damren et al. | |
| 2018/0228059 | A1 * | 8/2018 | Matsuo | H05K 7/20772 |
| 2019/0074750 | A1 | 3/2019 | Sangli et al. | |
| 2019/0109433 | A1 * | 4/2019 | Takigawa | H01S 5/02423 |
| 2019/0195537 | A1 * | 6/2019 | Ooka | F28F 3/12 |
| 2019/0279917 | A1 * | 9/2019 | Gohara | F28F 3/025 |

FOREIGN PATENT DOCUMENTS

| | | | | |
|---|---|---|---|---|
| CN | 107052571 | A | | 8/2017 |
| CN | 109648197 | A | | 4/2019 |
| EP | 3167998 | A1 | | 5/2017 |
| GB | 2488879 | A | | 9/2012 |
| JP | 5943669 | B2 | | 7/2016 |
| WO | WO-2016033343 | A1 * | 3/2016 | ............ B22F 1/0011 |
| WO | WO2020041786 | A2 | | 2/2020 |

* cited by examiner

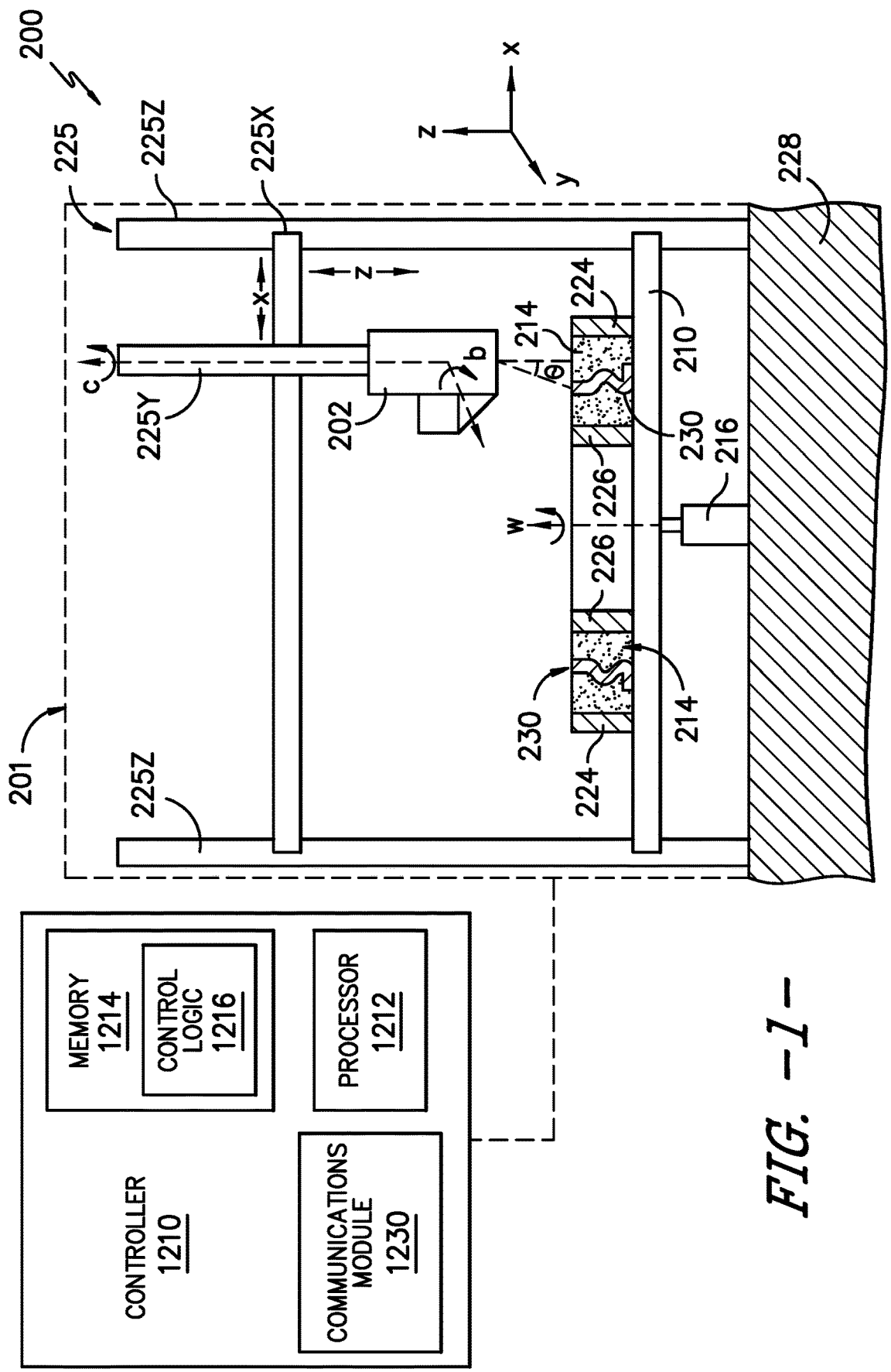
FIG. -1-

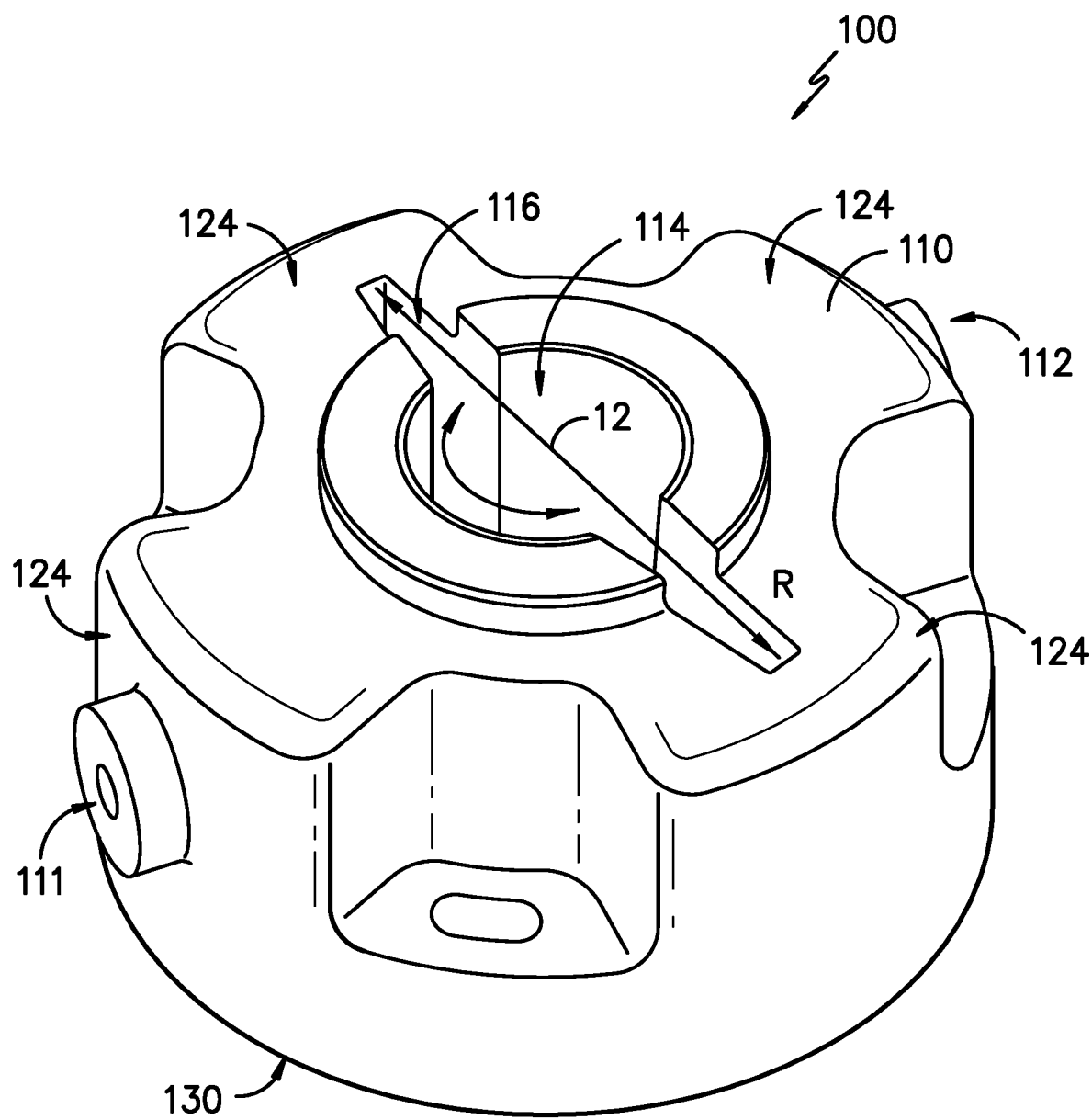
FIG. -2-

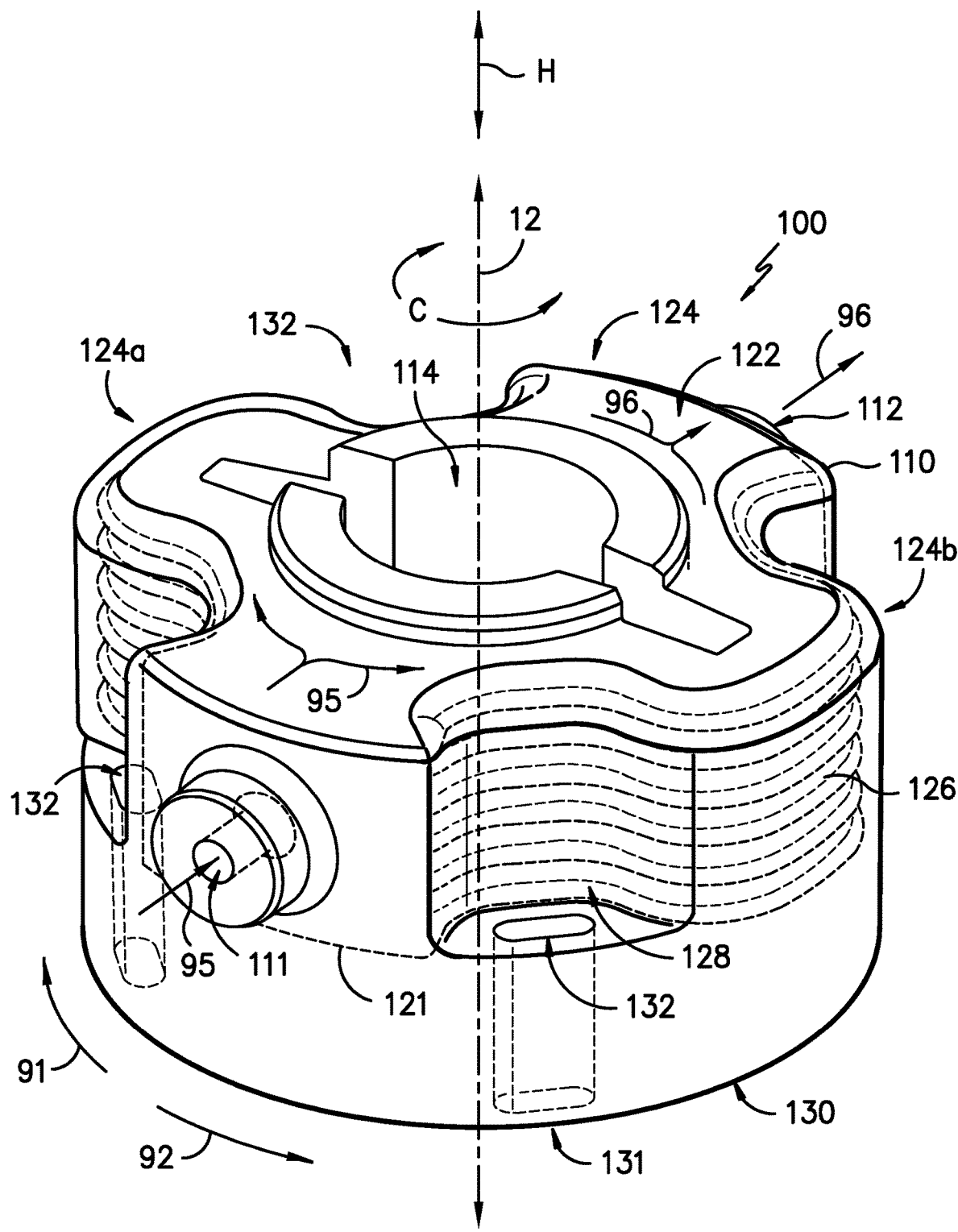
FIG. -3-

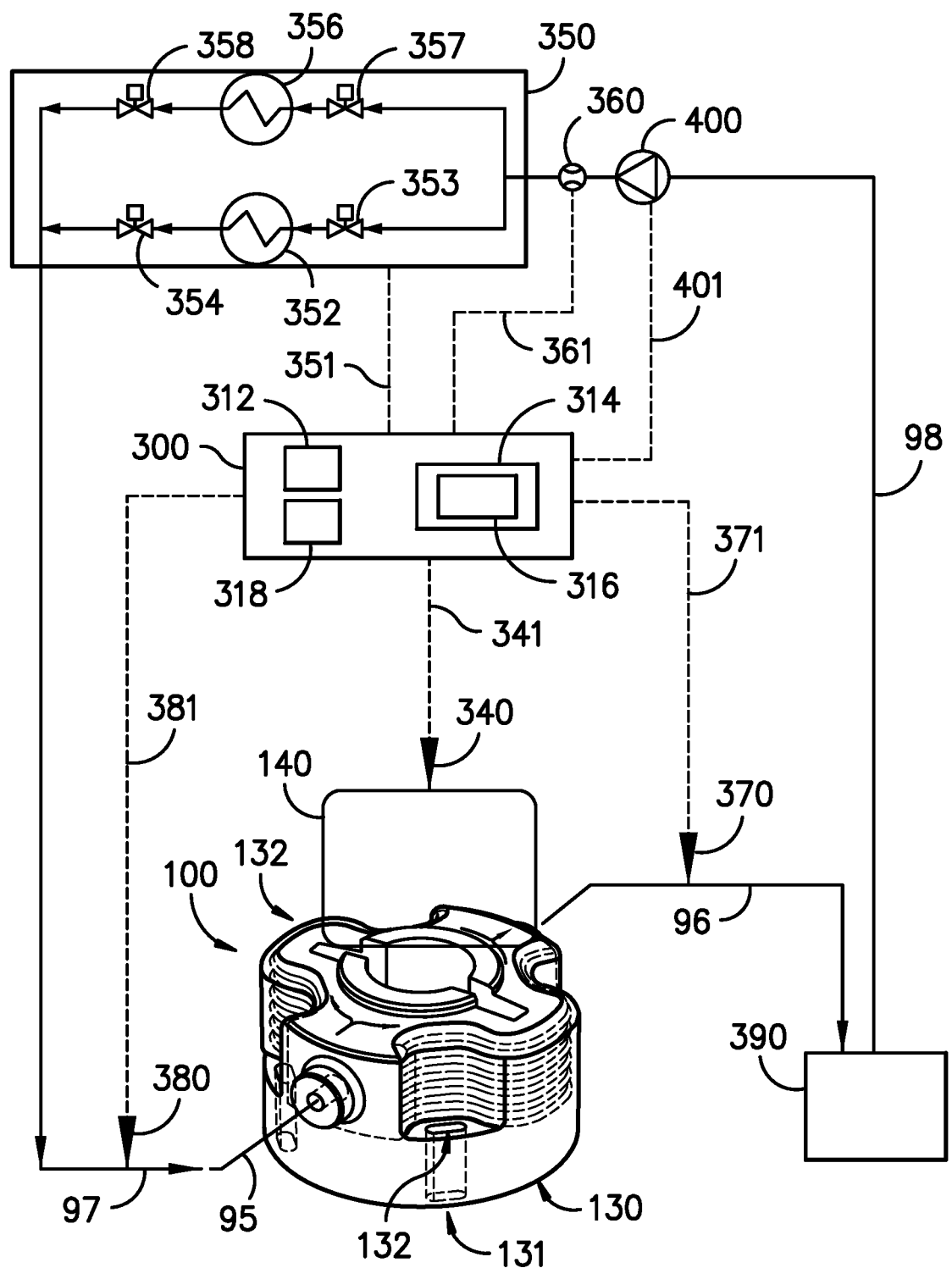
FIG. -4-

THERMAL CONTROL APPARATUS FOR LASER SYSTEM

FIELD

The present disclosure generally relates to a thermal control structure and control system for one or more components of an electromagnetic radiation emission system. More specifically, the present disclosure relates to a heat transfer fluid flow control structure and control system for one or more components of an electromagnetic radiation emission system for an additive manufacturing apparatus.

BACKGROUND

Additive manufacturing (AM) encompasses a variety of technologies for producing components in an additive, layer-wise fashion. AM apparatuses generally include a focused energy beam or laser system directed to a material. For instance, in powder bed fusion, a focused energy beam is used to fuse powder particles together on a layer-wise basis. The energy beam may be either an electron beam or laser. Laser powder bed fusion processes are referred to in the industry by many different names, the most common of which being selective laser sintering (SLS) and selective laser melting (SLM), depending on the nature of the powder fusion process. When the powder to be fused is metal, the terms direct metal laser sintering (DMLS) and direct metal laser melting (DMLM) are commonly used.

Accuracy or precision of electromagnetic radiation emission systems, such as lasers, are affected by temperatures of components of the system, such as motors, frames, or mounts. Conventional laser systems may include preset gas flows, such as to keep the laser system or its components below a maximum temperature. Conventional additive manufacturing apparatuses may further include large reservoirs or flow systems, allowing for high flow rates or quantities of gas to such laser systems. However, such systems may inhibit more efficient packaging or promote excess gas usage.

As such, there is a need for structures and methods for improved temperature control and distribution at one or more components of an electromagnetic radiation emission system.

BRIEF DESCRIPTION

Aspects and advantages of the invention will be set forth in part in the following description, or may be obvious from the description, or may be learned through practice of the invention.

An aspect of the present disclosure is directed to a thermal control apparatus including a body defining a centerline axis extended along a height and a circumferential direction extended relative to the centerline axis. The body forms a flow circuit therethrough, an inlet opening, and an outlet opening each in fluid communication with the flow circuit. The flow circuit is extended in parallel flow arrangement along the circumferential direction from the inlet opening to the outlet opening. A cavity is extended at least partially through the body along the centerline axis.

Another aspect of the present disclosure is directed to a thermal control system including the thermal control apparatus, a fluid flow device configured to provide a flow of heat transfer fluid to the apparatus through the inlet opening and to receive the flow of heat transfer fluid from the outlet opening of the apparatus, and a flow conduit providing fluid communication of the flow of heat transfer fluid between the fluid flow device and the apparatus.

Yet another aspect of the present disclosure is directed to an additive manufacturing apparatus including a build unit comprising a powder delivery mechanism, a powder recoating mechanism, and an irradiation beam directing mechanism comprising an electromagnetic radiation emission system component, a build platform, and the thermal control system in thermal communication with the electromagnetic radiation emission system component.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a schematic diagram showing a front view, cross section of an additive manufacturing apparatus according an aspect of the present disclosure;

FIG. 2 is a perspective view of a thermal control apparatus for an electromagnetic radiation emission system;

FIG. 3 is an internal view of the thermal control apparatus of FIG. 2; and

FIG. 4 is a schematic diagram of a thermal control system including the thermal control apparatus of FIGS. 3-4.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one component from another and are not intended to signify location or importance of the individual components.

The terms "upstream" and "downstream" refer to the relative direction with respect to fluid flow in a fluid pathway. For example, "upstream" refers to the direction from which the fluid flows, and "downstream" refers to the direction to which the fluid flows.

The present disclosure provides embodiments of a thermal control apparatus and control system for electromagnetic radiation emission systems, including energy beam systems such as lasers or electron beam processing (hereinafter referred to as "lasers" or "laser scanning systems"). Embodiments of the thermal control apparatus and control system depicted and described herein mitigate thermal drift and instability in components of laser scanning systems, allowing for improved accuracy and precision of the laser. Embodiments of the apparatus and control system include a body surrounding a portion of a laser system, such as a galvanometer. A heat transfer fluid flow circuit is extended through the body and surrounding the portion of the laser system surrounded by the body. The heat transfer fluid flow circuit includes a parallel flow around the laser system, allowing for substantially uniform or even heat transfer and reduced thermal gradient. Such improved heat transfer and thermal gradient mitigates thermal shift due to change in temperature at laser components such as a galvanometer motor, or thermal expansion of the galvanometer assembly generally.

Conventional systems may allow for undesired shifting of beam pointing accuracy of up to 100 microns or more from a relatively cold phase to a steady-state phase due to thermal shift. Conventional systems may include bulk gas flow to a laser system, allowing for non-uniform flows to fluidly or thermally communicate with portions of the laser component while leaving other portions less exposed or un-exposed to the cooling gas flow.

An additive manufacturing apparatus provided herein includes a build unit assembly. The build unit assembly includes certain build components, including, a powder recoating mechanism and an irradiation beam directing mechanism. The build unit is attached to a positioning mechanism that allows two- or three-dimensional movement (along x-, y- and z-axes) throughout the build environment, as well as rotation of the build unit in a way that allows leveling of the powder in any direction desired. The positioning mechanism may be a gantry, a delta robot, a cable robot, a robotic arm, a belt drive, or other appropriate positioning mechanism.

Various embodiments of the additive manufacturing apparatus further include a build platform, or any appropriate additive manufacturing machine where the scan head moves relative to the build platform. For example, the build platform may include an X, Y, Z gantry system where the processing area moves about the build platform. Particular embodiments of the build platform include a substantially circular configuration. However, it should be appreciated that other embodiments may include other shape configurations. In certain embodiments, the build unit of the apparatus is mobile, which may eliminate the need to lower the build platform as successive layers of powder are built up. In a still particular embodiments, the rotating build platform of the present disclosure is vertically stationary.

FIG. 1 depicts a schematic representation of an additive manufacturing apparatus 200 of an embodiment of the present disclosure. The apparatus 200 may include a build enclosure 201 housing the entire apparatus 200 and object 230 to be built. The apparatus 200 includes a build unit 202 and a rotating build platform 210. During operation, the apparatus builds an object 230 in a powder bed 214 formed between one or both of an outer grown build envelope 224 or an inner build envelope 226. The object 230 may be a large annular object, such as, but not limited to, a turbine or vane shrouding, a central engine shaft, a casing, a compressor liner, a combustor liner, a duct, an array of smaller objects arranged onto the large build platform, etc.

The build unit 202 may be configured to include several components for additively manufacturing a high-precision, large-scale object or multiple smaller objects. A mobile build unit 202 includes a powder delivery mechanism, a powder recoating mechanism, a gas-flow mechanism with a gas-flow zone and an irradiation beam directing mechanism. Examples of powder-based additive layer manufacturing include but are not limited to selective laser sintering (SLS), selective laser melting (SLM), direct metal laser sintering (DMLS), direct metal laser melting (DMLM) and electron beam melting (EBM) processes.

Representative examples of suitable powder materials for embodiments of the apparatus depicted and described herein may include metallic alloy, polymer, or ceramic powders. Exemplary metallic powder materials are stainless steel alloys, cobalt-chrome, aluminum alloys, titanium alloys, nickel based superalloys, and cobalt based superalloys. In addition, suitable alloys may include those that have been engineered to have good oxidation resistance, known "superalloys" which have acceptable strength at the elevated temperatures of operation in a gas turbine engine, e.g. Hastelloy, Inconel alloys (e.g., IN 738, IN 792, IN 939), Rene alloys (e.g., Rene N4, Rene N5, Rene 80, Rene 142, Rene 195), Haynes alloys, Mar M, CM 247, CM 247 LC, C263, 718, X-850, ECY 768, 282, X45, PWA 1483 and CMSX (e.g. CMSX-4) single crystal alloys. The manufactured objects of the present disclosure may be formed with one or more selected crystalline microstructures, such as directionally solidified ("DS") or single-crystal ("SX").

The build unit positioning mechanism 225 may be an X-Y-Z gantry that has one or more x-crossbeams 225X (one shown in FIG. 1) that independently move the build unit 202 along the x-axis (i.e. left or right), one or more y-crossbeams 225Y (one shown in FIG. 1) that respectively move the build unit 202 along the y-axis (i.e. inward or outward). Such two-dimensional movements across the x-y plane are substantially parallel to the build platform 210 or a build area therewithin. Additionally, the build unit positioning mechanism 225 has one or more z-crossbeams 225Z (two shown in FIG. 1) that moves the build unit 202 along the z-axis (i.e. upward and downward or substantially perpendicular to the build platform 210 or a build area therewithin). The build unit positioning mechanism 225 is further operable to rotate the build unit 202 around the c-axis and also the b-axis. The build unit positioning mechanism 225 may also be a robotic arm (not shown) or other suitable mechanism as desired.

The build platform 210 may be a rigid, ring-shaped or annular structure (i.e. with an inner central hole) configured to rotate 360° around the center of rotation W, or the build platform may be a disk without a central hole. The rotating build platform 210 may be secured to an end mount of a motor 216 that is operable to selectively rotate the build platform 210 around the center of rotation W such that the build platform 210 moves in a circular path. The motor 216 may be further secured to a stationary support structure 228. The motor may also be located elsewhere near the apparatus and mechanically connected with the build platform via a belt for translating motion of the motor to the build platform. Alternatively, the build platform 210 may be a rectangular or substantially polygonal structure. The build platform 210 may be configured as stationary relative to moveable build units, or as a translating member.

The additive manufacturing apparatus 200 may further include a controller 1210 configured to operate the build platform, the build unit positioning mechanism, and the build unit to form a build part. The controller 1210 may generally correspond to any suitable processor-based device, including one or more processors 1212 and associated memory 1214 storing control logic 1216 that, when executed by the one or more processors, causes the additive manufacturing apparatus to perform a variety of computer-implemented functions, such as articulating the build platform, the build unit, or the built unit positioning mechanism, discharging energy, and flowing process fluid in accordance with any suitable additive manufacturing method and the methods described further herein. The controller 1210 may further include a communications interface module 1230 configured to send and receive data and signals in accordance with any suitable method for operating an additive manufacturing apparatus. The communications interface module 1230 may further be configured to communicate with a controller 300 such as further described below.

Referring now to FIGS. 2-4, embodiments of the thermal control apparatus 100 and thermal control system 1000 provided herein include a body 110 forming an internal flow circuit 126 within the body 110. An inlet opening 111 receives a flow of heat transfer fluid, depicted schematically via arrows 95. The heat transfer fluid may include a cooling gas or cooling liquid generally, or one or more inert gases, water, or liquid-based or gas-based coolants particularly. The inlet opening 111 is in fluid communication with the flow circuit 126 within the body 110. An outlet opening 112 receives the flow of heat transfer fluid from the flow circuit 126, allowing the heat transfer fluid to egress from the body 110, such as depicted schematically via arrows 96.

Referring particularly to FIGS. 2-3, a substantially hollow cavity 114 is formed through the body 110. In certain embodiments, the body 110 defines a centerline axis 12 along which a height H is extended. A circumferential direction C is defined relative to the centerline axis 12, and a radial direction R is extended from the centerline axis 12. The body 110 is extended along the height H and the circumferential direction C. The cavity 114 is extended along the height H along the centerline axis 12. In various embodiments, the body 110 is a substantially cylindrical body. However, it should be appreciated that in other embodiments exterior walls of the body may be formed as one or more polygonal cross sectional structures.

The flow circuit 126 extends along the circumferential direction C through the body 110 and around the cavity 114. The flow circuit 126 includes an inlet plenum 121 at the inlet opening 111 and an outlet plenum 122 at the outlet opening 112. A flow passage 128 is extended along the circumferential direction C through the body 110 in parallel flow arrangement from the inlet plenum 121 to the outlet plenum 122. Stated differently, the flow circuit 126 is extended along a first circumferential direction, depicted via arrows 91 in FIG. 3, from the inlet plenum 121 to the outlet plenum 122. Furthermore, the flow circuit 126 is extended along a second circumferential direction, depicted via arrows 92, opposite of the first circumferential direction 91 from the inlet plenum 121 to the outlet plenum 122.

In various embodiments, the flow circuit 126 forms a plurality of lobes 124. In a particular embodiment, the flow circuit 126 forms a clover-shaped structure within the body 110. In certain embodiments, from one lobe (e.g., a first lobe 124*a*) to a diametrically-opposed lobe (e.g., a second lobe 124*b*), a slot 116 is extended through the body 110 along the radial direction R extended from the centerline axis 12. In various embodiments, the slot 116 is extended along the radial direction R from the centerline axis 12 and through the hollow cavity 114. The slot 116 may furthermore extend from the centerline axis 12 at which the cavity 114 is centered.

Referring still to FIGS. 2-3, in various embodiments, the flow circuit 126 may include a plurality of flow passages 128 stacked in adjacent arrangement along the height H. Each flow passage 128 may include a walled conduit fluidly separating the adjacently stacked flow passages 128. In certain embodiments, the flow circuit 126 may include turbulator structures within the flow paths. Turbulator structures may include desired protrusions, bumps, spikes, mounds, dimples, or other surface roughness features at the flow circuit 126 to generate a turbulent flow within the flow circuit 126.

Various features of the apparatus 100 may allow for desired flow characteristics, such as to promote more even temperature at radially inward dimensions proximate to an electromagnetic radiation emission component 140 (hereinafter referred to as "laser component 140"), such as depicted in FIG. 4, compared to radially outward dimensions proximate to an outer wall of the body 110. The flow passage 128 including the lobes 124 is formed in substantially even or symmetric arrangement through the body 110, such as to allow for substantially constant or even geometry of the circuit.

The body 110 may include a base portion 130 at a lower end 131 along the height H. The lower end 131 may be configured to allow the base portion 130 to mount onto a housing 150 (FIG. 4) for electromagnetic radiation emission optics, such as a laser box housing mirrors or other optics. An upper end 132 may be configured to receive the laser component 140, such as a galvanometer, onto the body 110 and through the cavity 114. The slot 116 may allow for various galvanometers or other laser components to fit through the cavity 114.

An opening 123 is extended along the height H through the base portion 130, such as to fix one or more laser components 140 to the body 110, or to fix the body 110 onto the housing 150, or both. The opening 123 is positioned between circumferentially adjacent lobes 124.

Referring now to FIG. 4, an embodiment of a thermal control system 1000 including the thermal control apparatus 100 described with regard to FIGS. 2-3 is provided. Embodiments of the system 1000 provided herein allow for active temperature control, stability, and uniformity for laser components such as galvanometers. Embodiments of the system 1000 include a fluid flow device 400 configured to provide the input flow of heat transfer fluid 95 to the apparatus 100 and to receive the output flow of heat transfer fluid 96 from the apparatus 100. In various embodiments, the fluid flow device 400 is a pump, such as, but not limited to, an inline pump, a positive displacement pump, a centrifugal pump, a rotary pump, or other appropriate mechanism for generating a flow of fluid through a flow conduit 97.

A controller 300 is configured to receive and transmit signals from sensors positioned in operative communication at the flow conduit 97 through which the heat transfer fluid 95, 96, 98 flows to and from the apparatus 100. A flow control device 350 is positioned at the flow conduit 97 to actively alter or change a flow rate of the heat transfer fluid at the flow conduit 97 through the apparatus 100. The flow control device 350 is furthermore configured to actively control or change the temperature of the heat transfer fluid. In various embodiments, the flow control device 350 includes a first heat exchanger 352 configured to add heat or thermal energy to the heat transfer fluid. In still various embodiments, the flow control device includes a second heat exchanger 356 configured to remove heat or thermal energy from the heat transfer fluid. The heat exchangers may include heat pumps, heater elements, burners, thermoelectric heaters or coolers, refrigeration elements, cryocoolers, closed cycle systems, or other appropriate mechanisms for desirably and actively altering the temperature of the heat transfer fluid prior to entering the apparatus 100.

Certain embodiments of the flow control device 350 bifurcate the flow conduit 97 to allow for a parallel flow of heat transfer fluid to the first heat exchanger 352 and the second heat exchanger 356. Particular embodiments of the flow control device 350 include a first upstream valve 353 positioned upstream of the first heat exchanger 352. Still particular embodiments of the flow control device 350 includes a first downstream valve 354 positioned downstream of the first heat exchanger 352. Certain embodiments further include a second upstream valve 357 positioned upstream of the second heat exchanger 356 and a second downstream valve 358 positioned downstream of the second heat exchanger 356. The upstream valves 353, 357 are each configured to control or alter a mass or volume of heat transfer fluid entering thermal communication at the respective heat exchangers 352, 356. The downstream valves 354, 358 are each configured to control or alter the mass or volume of heat transfer fluid leaving thermal communication at the respective heat exchanger 352, 356. Opening and closing of respective pairs of upstream and downstream valves desirably alters residence time of the heat transfer fluid in thermal communication at the respective heat exchanger. It should be appreciated that the valves 353, 354, 357, 358 may include any appropriate mechanism for altering mass or volumetric flow of fluid through the flow conduit 97, including, but not limited to, butterfly valves, gate valves, diaphragms, globe valves, check valves, ball valves, actuators, mass flow controllers, actuatable limiters, or other appropriate valve types.

A flow rate sensor 360 is positioned at the flow conduit 97 to obtain, measure, or otherwise determine a volumetric or mass flow rate of heat transfer fluid received at the apparatus 100. It should be appreciated that the flow rate sensor 360 may include a flow meter, such as, but not limited to, mechanical flow meters, pressure-based flow meters, variable area flow meters, optical flow meters, vortex flow meters, or other appropriate type of device of obtaining, measuring, or otherwise determining flow rate of fluid through the flow conduit 97. In certain embodiments, the flow rate sensor 360 is positioned along the flow conduit 97 downstream of the fluid flow device 400. In particular embodiments, the flow rate sensor 360 is positioned along the flow conduit 97 upstream of the flow control device 350. In still certain embodiments, the flow rate sensor 260 is furthermore positioned upstream of the thermal control apparatus 100.

The flow rate sensor 360 may be configured to obtain a total flow of heat transfer fluid entering the flow control device 350. In other embodiment, a plurality of flow rate sensors may be positioned at respective parallel flow segments of the flow control device 350, such as to determine flow rates to or from each respective heat exchanger 352, 356.

A downstream temperature sensor 370 is positioned at the flow conduit 97 to obtain, measure, or otherwise determine an output temperature of the heat transfer fluid 96 egressing the apparatus 100. In certain embodiments, the system 1000 further includes an upstream temperature sensor 380 positioned at the flow conduit 97 to obtain, measure, or otherwise determine an inlet temperature of the heat transfer fluid 95 entering the apparatus 100. It should be appreciated that the temperature sensors 370, 380 may include a thermocouple, or other devices for obtaining, measuring, or otherwise determining temperature of the heat transfer fluid at the flow conduit 97.

In certain embodiments, the downstream temperature sensor 370 is positioned downstream of the thermal control apparatus 100 and upstream of the fluid flow device 400. The downstream temperature sensor 370 may particularly receive, obtain, measure, or otherwise determine the output temperature of the heat transfer fluid 96 egressed from the thermal control apparatus 100 after thermal communication with the laser component 140.

In still certain embodiments, the upstream temperature sensor 380 is positioned upstream of the thermal control apparatus 100 and downstream of the flow control device 350. The upstream temperature sensor 380 may particularly receive, obtain, measure, or otherwise determine the inlet temperature of the heat transfer fluid 95 egressed from the flow control device 350 and entering the apparatus 100 prior to thermal communication with the laser component 140.

A component temperature sensor 340 is positioned in thermal communication with the laser component 140. In some embodiments, controller 300 is configured to receive a component temperature signal 341 from the component temperature sensor 340. The component temperature signal 341 corresponds to temperature or a critical performance measurement at the laser component 140. The component temperature signal 341 may be a temperature signal corresponding to a galvanometer, or a galvanometer motor particularly.

In some embodiments, the system 1000 includes a tank or reservoir 390 at which the heat transfer fluid is stored. In one embodiment, the system 1000 includes the closed-loop serial flow arrangement of the fluid flow device 400, the flow control device 350, the thermal control apparatus 100, and the reservoir 390 along the flow conduit 97.

The controller 300 is configured to receive a flow device signal 351 from the flow control device 350 corresponding to a valve opening or closing or otherwise indicative of a change in area or volume through which the heat transfer fluid may flow through the flow conduit 97. The flow device signal 351 may be indicative of whether the flow control device 350 is a heating mode or a cooling mode. For instance, the flow device signal 351 may be indicative of one or more of the first upstream valve 353 or first downstream valve 354 being open, or relatively more open, than one or more of the second upstream valve 357 or second downstream valve 358 being closed, or relatively more closed, such that heat transfer fluid is flowing in thermal communication with the first heat exchanger 352 configured as a heater, or relatively greater thermal communication than the second heat exchanger 356 configured as a cooler. The flow device signal 351 may be indicative of one or more of the first upstream valve 353 or first downstream valve 354 being closed, or relatively more closed, than one or more of the second upstream valve 357 or second downstream valve 358 being open, or relatively more open, such that heat transfer fluid is flowing in thermal communication with the second heat exchanger 356 configured as a cooler, or relatively greater thermal communication than the first heat exchanger 352 configured as a heater.

The controller 300 is furthermore configured to receive a flow rate signal 361 from the flow rate sensor 360 corresponding to a flow rate of heat transfer fluid obtained, measured, or otherwise determined at the flow conduit 97. The controller 300 still further is configured to receive a output temperature signal 371 corresponding to a temperature of the heat transfer fluid 96 egressing the apparatus 100. In various embodiments, the controller 300 is configured to receive an input temperature signal 381 corresponding to a temperature of the heat transfer fluid 95 entering the apparatus 100. The input temperature signal 381 may particularly correspond to a temperature of the heat transfer fluid egressed from the flow control device 350.

The controller 300 is configured to receive the signals and actuate the valves at the flow control device 350 accordingly to adjust the inlet temperature of the heat transfer fluid 95 entering the thermal control apparatus 100. In certain embodiments, the controller 300 is configured to receive the signals an actuate the valves at the flow control device 350 to adjust the flow rate of heat transfer fluid 95 therethrough in thermal communication at one or both heat exchangers. Additionally, or alternatively, the controller 300 is configured to receive or transmit a flow signal 401 corresponding to a control signal for operating the flow device 400, such as to increase or decrease flow rate or pressure of the heat transfer fluid through the flow conduit 97. The actively controlled rate of flow or other physical characteristic of the heat transfer fluid allows for varying temperatures or residence times of heat transfer fluid at and through the thermal control apparatus 100 and/or flow control device 350. As such, the controller 300 desirably changes the temperature received at the laser component 140 through the apparatus 100, such as to provide temperature uniformity throughout an operational period of the laser component 140.

Although the flow control device 350, the flow rate sensor 360, and the temperature sensor 380 are depicted outside of the fluid flow device 400, various embodiments of the system 1000 may integrate one or all of the flow control device 350, flow rate sensor 360, temperature sensor 380, or the fluid flow device 400 as a single, integrated unit. In still various embodiments, the flow rate sensor 360 may include one or more pressure sensors and/or temperature sensors in conjunction with an area or volume at the flow control device 350 together configured to determine a flow rate of the heat transfer fluid.

Referring still to FIG. 4, in various embodiments, the controller 300 can generally correspond to any suitable processor-based device, including one or more computing devices. For instance, FIG. 4 illustrates one embodiment of suitable components that can be included within the controller 300. As shown in FIG. 4, the controller 300 may include a processor 312 and associated memory 314 configured to perform a variety of computer-implemented functions. In various embodiments, the controller 300 is configured to operate the system 1000 via to receiving, obtaining, measuring, determining, or transmitting one or more signals, such as described in regard to FIG. 4, to flow the heat transfer fluid in accordance with one or more embodiments of the apparatus 100 and system 1000 described herein.

As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits. Additionally, the memory 314 can generally include memory element(s) including, but not limited to, computer readable medium (e.g., random access memory (RAM)), computer readable non-volatile medium (e.g., flash memory), a compact disc-read only memory (CD-ROM), a magneto-optical disk (MOD), a digital versatile disc (DVD) and/or other suitable memory elements or combinations thereof.

As shown, the controller 300 may include control logic 316 stored in memory 314. The control logic 316 may include instructions that when executed by the one or more processors 312 cause the one or more processors 312 to perform operations, such as flowing, via the fluid flow device 400, the heat transfer fluid through the flow conduit 97 and apparatus 100; and obtaining, via the output temperature sensor 370, a temperature signal (e.g., the output temperature signal 371) corresponding to an output temperature of the heat transfer fluid 96 egressed from the apparatus 100. In various embodiments, the operations include obtaining, via the flow rate sensor 360, a flow rate signal (e.g., the flow rate signal 361) corresponding to a flow rate of the heat transfer fluid 95 entering the apparatus 100. Further operations may include transmitting, via a control signal (e.g., flow signal 401), a change in flow rate at the flow device 400. Further operations may include transmitting, via a control signal (e.g., flow device signal 351), a change in heat transfer mode at one or more heat exchangers (e.g., at the flow control device 350). In still another embodiment, the operations include adjusting the flow rate of the heat transfer fluid 95 to the apparatus 100 via the flow control device 350. Still further operations include obtaining, via the flow control device, the flow area at the flow conduit through which the heat transfer fluid flows to the thermal control apparatus 100. In certain embodiments, adjusting the flow rate of the heat transfer fluid 95 to the apparatus 100 is based at least on output temperature signal received from the output temperature sensor 370. In another embodiment, adjusting the flow rate of heat transfer fluid 95 to the apparatus 100 is based on a comparison (e.g., difference) of the input temperature signal received from the input temperature sensor 380 and the output temperature signal received from the output temperature sensor 370. In still certain embodiments, adjusting the flow rate of the heat transfer fluid 95 to the apparatus 100 is based on a component temperature signal (e.g., component temperature signal 341) corresponding to the laser component 140. Further operations may include maintaining a temperature of the laser component 140, corresponding to the component temperature signal, for a desired or predetermined period of time. Another embodiment of the operations includes determining a rate of heat transfer of the heat transfer fluid through the apparatus 100 via comparing the output temperature signal 371 and the input temperature signal 381. Still further operations may include adjusting or maintaining heat transfer fluid temperature based on a comparison of a power consumption parameter at the laser component 140.

In still various embodiments, the memory 314 may store charts, tables, functions, look ups, etc. corresponding to the flow rates, temperatures, areas, volumes, diameters, lengths, or rates of change relative to the heat transfer fluid, the flow conduit 97, or the apparatus 100.

Additionally, as shown in FIG. 4, the controller 300 may also include a communications interface module 318. In various embodiments, the communications interface module 318 can include associated electronic circuitry that is used to send and receive data. As such, the communications interface module 318 of the controller 300 can be used to receive data from one or more sensors at the additive manufacturing apparatus 200, the system 1000, the apparatus 100, or portions thereof. It should be appreciated that calculations or measurements corresponding thereto may include, but are not limited to, temperatures, pressures, physical properties, orifice or opening areas and/or volumes, or other physical properties or data that may be utilized to determine, obtain, or measure one or more flow rates or temperature gradients at the apparatus 100 or system 1000 disclosed herein. In addition, the communications interface module 318 can also be used to communicate with any other suitable components of the additive manufacturing apparatus 200, such as to receive data or send commands to/from the build unit 202, the build platform 210, the powder bed 214, the build unit positioning mechanism 225, one or more motors 216, or other controllable portions of the apparatuses 100, 200 or system 1000.

It should be appreciated that the communications interface module 318 can be any combination of suitable wired and/or wireless communications interfaces and, thus, can be communicatively coupled to one or more components of the apparatus via a wired and/or wireless connection. As such, the controller 300 may obtain, determine, store, generate, transmit, or operate any one or more steps of the method for control and operation described herein via a distributed network.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

Further aspects of the invention are provided by the subject matter of the following clauses:

1. An additive manufacturing apparatus, the additive manufacturing apparatus comprising a build unit comprising a powder delivery mechanism, a powder recoating mechanism, and an irradiation beam directing mechanism comprising an electromagnetic radiation emission system component; a build platform; a thermal control apparatus comprising a body defining a centerline axis extended along a height and a circumferential direction extended relative to the centerline axis, the body forming a flow circuit within the body, and wherein the body forms an inlet opening and an outlet opening each in fluid communication with the flow circuit, wherein the flow circuit is extended in parallel flow arrangement along the circumferential direction from the inlet opening to the outlet opening, and wherein a cavity is extended at least partially through the body along the centerline axis, wherein the body of the thermal control apparatus forms a plurality of lobes at the flow circuit, and wherein a slot is extended along a radial direction from the centerline axis between diametrically-opposed lobes of the plurality of lobes, and wherein the slot is extended at least partially along the height, and wherein the electromagnetic radiation emission system component is positioned through the slot and the cavity formed at the body of the thermal control apparatus; a fluid flow device configured to provide a flow of heat transfer fluid to the thermal control apparatus through the inlet opening and to receive the flow of heat transfer fluid from the outlet opening of the thermal control apparatus; and a flow conduit providing fluid communication of the flow of heat transfer fluid between the fluid flow device and the thermal control apparatus.

2. A thermal control system, the system comprising a thermal control apparatus comprising a body defining a centerline axis extended along a height and a circumferential direction extended relative to the centerline axis, the body forming a flow circuit within the body, and wherein the body forms an inlet opening and an outlet opening each in fluid communication with the flow circuit, wherein the flow circuit is extended in parallel flow arrangement along the circumferential direction from the inlet opening to the outlet opening, and wherein a cavity is extended at least partially through the body along the centerline axis; a fluid flow device configured to provide a flow of heat transfer fluid to the thermal control apparatus through the inlet opening and to receive the flow of heat transfer fluid from the outlet opening of the thermal control apparatus; and a flow conduit providing fluid communication of the flow of heat transfer fluid between the fluid flow device and the thermal control apparatus.

3. The thermal control system of any one or more clauses herein, wherein the body of the thermal control apparatus forms a plurality of lobes at the flow circuit.

4. The thermal control system of any one or more clauses herein, wherein a slot is extended along a radial direction from the centerline axis between diametrically-opposed lobes of the plurality of lobes, and wherein the slot is extended at least partially along the height.

5. The thermal control system of any one or more clauses herein, the system comprising an electromagnetic radiation emission system component positioned through the slot and the cavity formed at the body of the thermal control apparatus.

6. The thermal control system of any one or more clauses herein, the system comprising an electromagnetic radiation emission optics housing, wherein a base portion of the body of the thermal control apparatus is positioned onto the electromagnetic radiation emissions optics housing.

7. The thermal control system of any one or more clauses herein, wherein the body of the thermal control apparatus forms a plurality of flow passages at the flow circuit, the plurality of flow passage stacked in adjacent arrangement along the height of the body.

8. The thermal control system of any one or more clauses herein, wherein the body of the thermal control apparatus forms an inlet plenum at the flow circuit fluidly between the inlet opening and a flow passage at the flow circuit.

9. The thermal control system of any one or more clauses herein, wherein the body thermal control apparatus forms an outlet plenum at the flow circuit fluidly between the outlet opening and a flow passage at the flow circuit.

10. The thermal control system of any one or more clauses herein, the system comprising a flow rate sensor positioned along the flow conduit, wherein the flow rate sensor is configured to obtain a flow rate of the heat transfer fluid through the flow conduit; a temperature sensor positioned at the flow conduit, wherein the temperature sensor is configured to obtain an output temperature of the heat transfer fluid egressed from the thermal control apparatus; and a controller configured to receive a flow device signal from the flow control device, wherein the flow device signal corresponds to a flow area through which the heat transfer fluid flows through the flow conduit, and wherein the controller is configured to receive a flow rate signal corresponding to a flow rate of heat transfer fluid through the flow conduit obtained from the flow rate sensor, and wherein the controller is configured to receive a output temperature signal corresponding to the output temperature obtained from the temperature sensor.

11. The thermal control system of any one or more clauses herein, wherein the controller comprises one or more processors and memory, wherein instructions are stored in the memory that, when executed by the one or more processors, cause the one or more processors to perform operations, the operations comprising flowing, via the fluid flow device, the heat transfer fluid through the flow conduit and the thermal control apparatus; obtaining, via the temperature sensor, the output temperature signal corresponding to the output temperature of the heat transfer fluid egressed from the thermal control apparatus; and obtaining, via the flow rate sensor, the flow rate signal corresponding to the flow rate of the heat transfer fluid through the flow conduit.

12. The thermal control system of any one or more clauses herein, the operations comprising obtaining, via the flow control device, the flow device signal corresponding to the flow area at the flow conduit; and adjusting, via the flow control device, the flow rate of the heat transfer fluid through the flow conduit to the thermal control apparatus.

13. A thermal control apparatus, the thermal control apparatus comprising a body defining a centerline axis extended along a height and a circumferential direction extended relative to the centerline axis, the body forming a flow circuit within the body, and wherein the body forms an inlet opening and an outlet opening each in fluid communication with the flow circuit, wherein the flow circuit is extended in parallel flow arrangement along the circumferential direction from the inlet opening to the outlet opening, and wherein a cavity is extended at least partially through the body along the centerline axis.

14. The thermal control apparatus of any one or more clauses herein, the body forming a plurality of lobes at the flow circuit.

15. The thermal control apparatus of any one or more clauses herein, wherein a slot is extended along a radial direction from the centerline axis between diametrically-opposed lobes of the plurality of lobes.

16. The thermal control apparatus of any one or more clauses herein, wherein the slot is extended through the cavity along the radial direction, and wherein the slot is extended along the height.

17. The thermal control apparatus of any one or more clauses herein, wherein the flow circuit forms a clover structure within the body.

18. The thermal control apparatus of any one or more clauses herein, wherein the body forms a plurality of flow passages at the flow circuit, the plurality of flow passage stacked in adjacent arrangement along the height of the body.

19. The thermal control apparatus of any one or more clauses herein, wherein the body forms an inlet plenum at the flow circuit fluidly between the inlet opening and a flow passage at the flow circuit.

20. The thermal control apparatus of any one or more clauses herein, wherein the body forms an outlet plenum at the flow circuit fluidly between the outlet opening and a flow passage at the flow circuit.

21. The additive manufacturing apparatus of any one or more clauses herein, comprising the thermal control apparatus of any one or more clauses herein.

22. The additive manufacturing apparatus of any one or more clauses herein, comprising the thermal control system of any one or more clauses herein.

What is claimed is:

1. A thermal control system for an additive manufacturing apparatus, the thermal control system comprising:

a thermal control apparatus comprising a body defining a centerline axis extended along a height and a circumferential direction extended relative to the centerline axis, the body forming a flow circuit within the body, and wherein the body forms an inlet opening and an outlet opening each in fluid communication with the flow circuit, wherein the flow circuit is extended in parallel flow arrangement along the circumferential direction from the inlet opening to the outlet opening, wherein a cavity is extended at least partially through the body along the centerline axis, wherein the body forms a plurality of lobes at the flow circuit, wherein a slot is extended along a radial direction from the centerline axis between diametrically-opposed lobes of the plurality of lobes, wherein the slot is extended at least partially along the height, and wherein a portion of the flow circuit is within the plurality of lobes;

a fluid flow device configured to provide a flow of a heat transfer fluid to the thermal control apparatus through the inlet opening and to receive the flow of the heat transfer fluid from the outlet opening of the thermal control apparatus;

a flow conduit providing fluid communication of the flow of the heat transfer fluid between the fluid flow device and the thermal control apparatus;

a flow rate sensor positioned along the flow conduit, wherein the flow rate sensor is configured to obtain a flow rate of the heat transfer fluid through the flow conduit;

a temperature sensor positioned at the flow conduit, wherein the temperature sensor is configured to obtain an output temperature of the heat transfer fluid egressed from the thermal control apparatus; and a controller configured to receive a flow device signal from a flow control device, wherein the flow device signal corresponds to a flow area through which the heat transfer fluid flows through the flow conduit, and wherein the controller is configured to receive a flow rate signal corresponding to the flow rate of the heat transfer fluid through the flow conduit obtained from the flow rate sensor, and wherein the controller is configured to receive an output temperature signal corresponding to the output temperature obtained from the temperature sensor.

2. The thermal control system of claim 1, wherein the body defines a hole at least partially extending along the height of the thermal control apparatus.

3. The thermal control system of claim 2, the system comprising:

an electromagnetic radiation emission system component positioned through the slot and the cavity formed at the body of the thermal control apparatus.

4. The thermal control system of claim 2, the system comprising:

an electromagnetic radiation emission optics housing, wherein a base portion of the body of the thermal control apparatus is positioned onto the electromagnetic radiation emissions optics housing.

5. The thermal control system of claim 1, wherein the body of the thermal control apparatus forms a plurality of flow passages at the flow circuit, and wherein the plurality of flow passages are stacked in adjacent arrangement along the height of the body.

6. The thermal control system of claim 1, wherein the body of the thermal control apparatus forms an inlet plenum at the flow circuit fluidly between the inlet opening and a flow passage at the flow circuit.

7. The thermal control system of claim 1, wherein the body thermal control apparatus forms an outlet plenum at the flow circuit fluidly between the outlet opening and a flow passage at the flow circuit.

8. The system of claim 1, wherein the controller comprises one or more processors and memory, wherein instructions are stored in the memory that, when executed by the one or more processors, cause the one or more processors to perform operations, the operations comprising:
flowing, via the fluid flow device, the heat transfer fluid through the flow conduit and the thermal control apparatus;
obtaining, via the temperature sensor, the output temperature signal corresponding to the output temperature of the heat transfer fluid egressed from the thermal control apparatus; and
obtaining, via the flow rate sensor, the flow rate signal corresponding to the flow rate of the heat transfer fluid through the flow conduit.

9. The system of claim 8, the operations comprising:
obtaining, via the flow control device, the flow device signal corresponding to the flow area at the flow conduit; and
adjusting, via the flow control device, the flow rate of the heat transfer fluid through the flow conduit to the thermal control apparatus.

10. A thermal control apparatus for an additive manufacturing apparatus, the thermal control apparatus comprising:
a body defining a centerline axis extended along a height and a circumferential direction extended relative to the centerline axis, the body forming a flow circuit within the body, and wherein the body forms an inlet opening and an outlet opening each in fluid communication with the flow circuit, wherein the flow circuit is extended in parallel flow arrangement along the circumferential direction from the inlet opening to the outlet opening, wherein a cavity is extended at least partially through the body along the centerline axis, wherein the body forms a plurality of lobes at the flow circuit, wherein a slot is extended along a radial direction from the centerline axis between diametrically-opposed lobes of the plurality of lobes, wherein the slot is extended at least partially along the height, and wherein a portion of the flow circuit is within the plurality of lobes;
a flow conduit providing fluid communication between a fluid flow device and the thermal control apparatus;
a flow rate sensor positioned along the flow conduit, wherein the flow rate sensor is configured to obtain a flow rate of a heat transfer fluid through the flow conduit;
a temperature sensor positioned at the flow conduit, wherein the temperature sensor is configured to obtain an output temperature of the heat transfer fluid egressed from the thermal control apparatus; and
a controller configured to receive a flow device signal from a flow control device, wherein the flow device signal corresponds to a flow area through which the heat transfer fluid flows through the flow conduit, and wherein the controller is configured to receive a flow rate signal corresponding to the flow rate of the heat transfer fluid through the flow conduit obtained from the flow rate sensor, and wherein the controller is configured to receive an output temperature signal corresponding to the output temperature obtained from the temperature sensor.

11. The thermal control apparatus of claim 10, wherein the body defines a hole at least partially extending along the height of the thermal control apparatus.

12. The thermal control apparatus of claim 11, wherein the slot is extended through the cavity along the radial direction.

13. The thermal control apparatus of claim 10, wherein the flow circuit forms a clover structure within the body.

14. The thermal control apparatus of claim 10, wherein the body forms a plurality of flow passages at the flow circuit, the plurality of flow passage stacked in adjacent arrangement along the height of the body.

15. The thermal control apparatus of claim 10, wherein the body forms an inlet plenum at the flow circuit fluidly between the inlet opening and a flow passage at the flow circuit.

16. The thermal control apparatus of claim 10, wherein the body forms an outlet plenum at the flow circuit fluidly between the outlet opening and a flow passage at the flow circuit.

* * * * *